United States Patent
Sada et al.

(10) Patent No.: US 11,448,707 B2
(45) Date of Patent: Sep. 20, 2022

(54) BATTERY MANAGEMENT DEVICE, BATTERY SYSTEM, AND BATTERY MANAGEMENT METHOD FOR ESTIMATING TRANSITION OF AC RESISTANCE VALUE OF SECONDARY BATTERY

(71) Applicant: Panasonic Intellectual Property Management Co., Ltd., Osaka (JP)

(72) Inventors: Tomokazu Sada, Osaka (JP); Yukikazu Ohchi, Tokyo (JP); Kazuya Hayayama, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 307 days.

(21) Appl. No.: 16/639,458

(22) PCT Filed: Jul. 5, 2018

(86) PCT No.: PCT/JP2018/025526
§ 371 (c)(1),
(2) Date: Feb. 14, 2020

(87) PCT Pub. No.: WO2019/054020
PCT Pub. Date: Mar. 21, 2019

(65) Prior Publication Data
US 2020/0408842 A1 Dec. 31, 2020

(30) Foreign Application Priority Data
Sep. 15, 2017 (JP) .............................. JP2017-177635

(51) Int. Cl.
*G01R 31/389* (2019.01)
*G01R 31/36* (2020.01)
(Continued)

(52) U.S. Cl.
CPC ............ *G01R 31/389* (2019.01); *B60L 58/12* (2019.02); *G01R 31/3647* (2019.01);
(Continued)

(58) Field of Classification Search
CPC .. G01R 31/389; G01R 31/3647; G01R 31/36; G01R 31/392; H01M 10/425;
(Continued)

(56) References Cited

U.S. PATENT DOCUMENTS

2015/0338471 A1 11/2015 Ichikawa et al.
2017/0366023 A1* 12/2017 Tanaka ...................... H02J 7/35

FOREIGN PATENT DOCUMENTS

| JP | 9-61505 A | 3/1997 |
| JP | 2003-272713 A | 9/2003 |

(Continued)

OTHER PUBLICATIONS

Translation of KR20160150022, 20 pages (Year: 2016).*
(Continued)

*Primary Examiner* — Nathaniel R Pelton
(74) *Attorney, Agent, or Firm* — McDermott Will & Emery LLP

(57) ABSTRACT

According to the present invention, a state management unit measures or estimates the AC resistance value of a secondary cell at a plurality of time points, estimates a predicted transition of the AC resistance value of the secondary cell on the basis of the AC resistance value at the plurality of time points, and estimates a remaining use period until the AC resistance value of the secondary cell reaches a resistance threshold value corresponding to a time point at which usage of the secondary cell ends. When the remaining use period of the secondary cell becomes shorter than a prescribed period, an operation management unit changes the usage manner of the secondary cell method to a usage manner that (Continued)

has a smaller load on the secondary cell, or stops the usage of the secondary cell.

9 Claims, 9 Drawing Sheets

(51) Int. Cl.
| | |
|---|---|
| *B60L 58/12* | (2019.01) |
| *H01M 10/42* | (2006.01) |
| *H01M 10/44* | (2006.01) |
| *H01M 10/48* | (2006.01) |
| *H02J 7/00* | (2006.01) |

(52) U.S. Cl.
CPC ......... *H01M 10/425* (2013.01); *H01M 10/44* (2013.01); *H01M 10/48* (2013.01); *H02J 7/007* (2013.01); *H01M 2010/4271* (2013.01)

(58) Field of Classification Search
CPC ................. H01M 10/44; H01M 10/48; H01M 2010/4271; H02J 7/007; B60L 58/12
USPC ........................................................ 324/430
See application file for complete search history.

(56) References Cited

FOREIGN PATENT DOCUMENTS

| | | | |
|---|---|---|---|
| JP | 2010-067502 A | | 3/2010 |
| JP | 2010067502 | * | 3/2010 |
| JP | 2010-124629 A | | 6/2010 |
| JP | 2010124629 | * | 6/2010 |
| JP | 2011-189768 A | | 9/2011 |
| JP | 2013-102609 A | | 5/2013 |
| WO | 2016/135850 A1 | | 9/2016 |

OTHER PUBLICATIONS

International Search Report issued in corresponding International Patent Application No. PCT/JP2018/025526, dated Aug. 14, 2018, with English translation.

* cited by examiner

BATTERY MANAGEMENT DEVICE, BATTERY SYSTEM, AND BATTERY MANAGEMENT METHOD FOR ESTIMATING TRANSITION OF AC RESISTANCE VALUE OF SECONDARY BATTERY

CROSS-REFERENCE TO RELATED APPLICATIONS

This application is the U.S. National Phase under 35 U.S.C. § 371 of International Patent Application No. PCT/JP2018/025526, filed on Jul. 5, 2018, which in turn claims the benefit of Japanese Patent Application No. 2017-177635, filed on Sep. 15, 2017, the entire disclosures of which Applications are incorporated by reference herein.

TECHNICAL FIELD

The present disclosure relates to battery management devices, battery systems, and battery management methods adapted to manage the use of secondary batteries.

BACKGROUND ART

In recent years, the demand for lithium ion batteries has grown. Lithium ion batteries are used in various applications such as vehicle-mounted applications (e.g., HEV, PHEV, EV), stationary storage battery applications, electronic device applications (e.g., PCs, smartphones, etc.). In particular, the number of HEVs, PHEVs, and EVs shipped has increased, and more and more vehicle-mounted lithium ion batteries are shipped.

If a secondary battery like a lithium ion battery is charged and discharged repeatedly at a low temperature, abrupt capacity degradation could easily occur. Also, abrupt capacity degradation could easily occur if a secondary battery is charged and discharged repeatedly at a high rate. Abrupt capacity degradation occurs due, for example, to decreased volume of electrolysis solution, reduced area of polar plate reaction, etc. After the capacity is abruptly degraded, the input and output performance is significantly reduced. Further, lithium dissolved in the form of ions is easily deposited as a metal. Deposition of metallic lithium may result in the metallic lithium passing through the separator and short-circuiting the positive electrode and the negative electrode. Thus, the stability and safety of a secondary battery are lowered after an abrupt capacity degradation so that the use of the secondary battery is basically ended (see, for example, patent literature 1).

PATENT LITERATURE

Patent Literature 1: JP2015-222195

SUMMARY OF INVENTION

As described above, a secondary battery can no longer be used basically if an abrupt capacity degradation of the secondary battery occurs. It is therefore necessary to delay occurrence of abrupt degradation as long as possible in order to extend the life of the secondary battery.

The disclosure addresses the above-described issue, and a general purpose thereof is to provide a technology of delaying occurrence of abrupt capacity degradation of a secondary battery.

A battery management device including: a state management unit that measures or estimates an AC resistance value of a secondary battery at a plurality of points of time, estimates transition of the AC resistance value of the secondary battery by referring to AC resistance values at the plurality of points of time, and estimates a remaining period of use elapsed until the AC resistance value of the secondary battery reaches a resistance threshold value corresponding to a point of time of end of use of the secondary battery; and an operation management unit that changes a method of use of the secondary battery to a method of use that imposes a smaller load or stops using the secondary battery, when the remaining period of use of the secondary battery is shorter than a predetermined period of time.

Optional combinations of the aforementioned constituting elements, and implementations of the disclosure in the form of methods, apparatuses, systems, and computer programs may also be practiced as additional modes of the present disclosure.

According to the disclosure, occurrence of abrupt capacity degradation of the secondary battery can be delayed.

DESCRIPTION OF EMBODIMENTS

Figure 1:
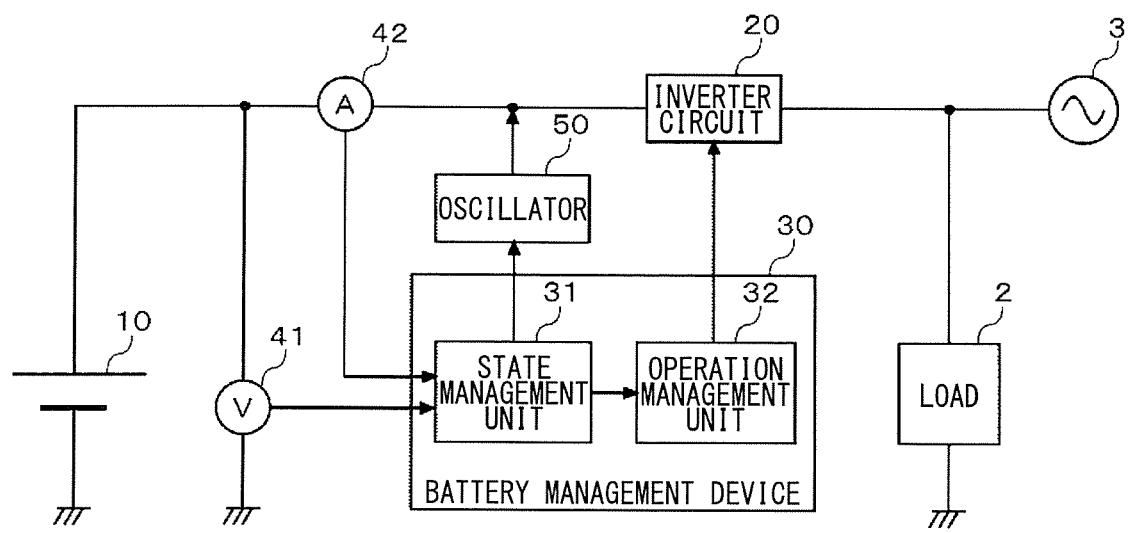
FIG. 1 shows an exemplary configuration of a battery system according to embodiment 1 of the present disclosure.

FIG. 1 shows an exemplary configuration of a battery system 1 according to embodiment 1 of the present disclosure. The battery system 1 includes a secondary battery 10, an inverter circuit 20, a battery management device 30, a voltage sensor 41, a current sensor 42, and an oscillator 50. A chemical battery like a lithium ion battery, a nickel hydride battery, and a lead battery, etc. can be used as the secondary battery 10. In this embodiment, it is assumed that a lithium ion battery is used. It is basically assumed that the secondary battery 10 is a cell, but the secondary battery 10 may be a module including a combination of a plurality of cells.

The inverter circuit 20 converts the DC power discharged from the secondary battery 10 into an AC power and outputs it to a load 2 or a commercial power system (hereinafter, referred to as a power system) 3. The inverter circuit 20 also converts the AC power supplied from the power system 3 into a DC power and charges the secondary battery 10 accordingly. The inverter circuit 20 can control the current/voltage in accordance with a command from the battery management device 30. For example, constant-current (CC) charging/discharging or constant-voltage (CV) charging/discharging of the secondary battery 10 are possible.

In the case the battery system 1 is used in vehicle-mounted applications, the load 2 is a vehicle driving motor. The system is connected to the power system 3 via a plug when the vehicle is parked. The inverter circuit 20 is also capable of converting the AC power regenerated by the vehicle driving motor into a DC power to charge the secondary battery 10. In the case the battery system 1 is a stationary storage system used to address peak shift or for backup, the inverter circuit 20 is a power conditioner (PCS).

The voltage sensor 41 measures the voltage of the secondary battery 10 and outputs the measurement to the battery management device 30. For example, a differential amplifier may be used as the voltage sensor 41 In the case a plurality of cells are connected in series to form the secondary battery 10, it is preferred to provide the voltage sensor 41 for each series connection.

The current sensor 42 measures the current flowing through the secondary battery 10 and outputs the measurement to the battery management device 30. For example, a combination of a shunt resistance/a Hall element and a differential amplifier or a CT sensor may be used as the current sensor 42. The oscillator 50 can generate an AC signal (e.g., a sinusoidal wave, a rectangular wave) and can apply the generated AC signal to the secondary battery 10. An LC oscillator, an RC oscillator, a crystal oscillator, etc. can be used as the oscillator.

The battery management device 30 includes a state management unit 31 and an operation management unit 32 and manages the state and operation of the secondary battery 10. The configuration of the battery management device 30 can be realized by coordination of hardware resources and software resources or by hardware resources only. A microcomputer, DSP, FPGA, ROM, RAM, and other LSIs can be used as hardware resources. Programs such as firmware can be used as software resources.

The state management unit 31 manages the state of the secondary battery 10 by referring to the voltage value input from the voltage sensor 41, the current value input from the current sensor 42, and the temperature value input from a temperature sensor (not shown). State of charge (SOC) and state of health (SOH) of the secondary battery 10 are managed as items of management relevant to the embodiment. SOC can be estimated by an integrated current method or an open circuit voltage method.

SOH is defined as a ratio of a current full charging capacity relative to the initial full charging capacity. The smaller the value, the farther the degradation has proceeded. SOH may be determined by measuring the capacity in complete charging/discharging. Alternatively, SOH may be estimated based on a rate of degradation at rest and a rate of current degradation obtained in advance by an experiment or simulation. Rate of degradation at rest is mainly determined by SOC and temperature, and current degradation is mainly determined by an integrated amount of current and temperature. The state management unit 31 is capable of estimating the degree of degradation at rest based on the rate of degradation at rest, SOC, and temperature, calculating the degree of current degradation based on the rate of current degradation, integrated amount of current, and temperature, and estimating the SOH of the secondary battery 10 by totaling the degree of degradation at rest and the degree of current degradation.

The operation management unit 32 generates a current command value/power command value based on the state of the secondary battery 10 managed by the state management unit 31 and sets the command in the inverter circuit 20. The inverter circuit 20 controls charging and discharging in accordance with the current command value/power command value set by the operation management unit 32.

Degradation of the secondary battery 10 proceeds as the number of times of charging and discharging increases. In other words, SOH drops as the number of times of charging and discharging increases. SOH drops by basically maintaining a substantially constant slope, although the manner of drop depends on the type of the battery. As described above, abrupt degradation could easily occur when the battery is repeatedly used in a manner that imposes a heavy load on the battery such as when the battery is charged and discharged in a low or high temperature environment or charged and discharged at a high rate. Occurrence of abrupt degradation basically makes it impossible to use the battery and so reduces the life of the battery.

The main cause of abrupt degradation is decreased volume of electrolysis solution. It is necessary to disassemble the battery to measure the volume of electrolysis solution directly, and it is not realistic to disassemble the battery while the battery is being used. In this regard, a method of estimating the internal state of the battery from outside and sensing a predictor of abrupt degradation without disassembling the battery is called for. There is a method of estimating the internal state of a battery by applying an AC signal of a frequency band that an electrolysis solution reacts from outside the battery and measuring/estimating the AC resistance of the battery.

Figure 2:
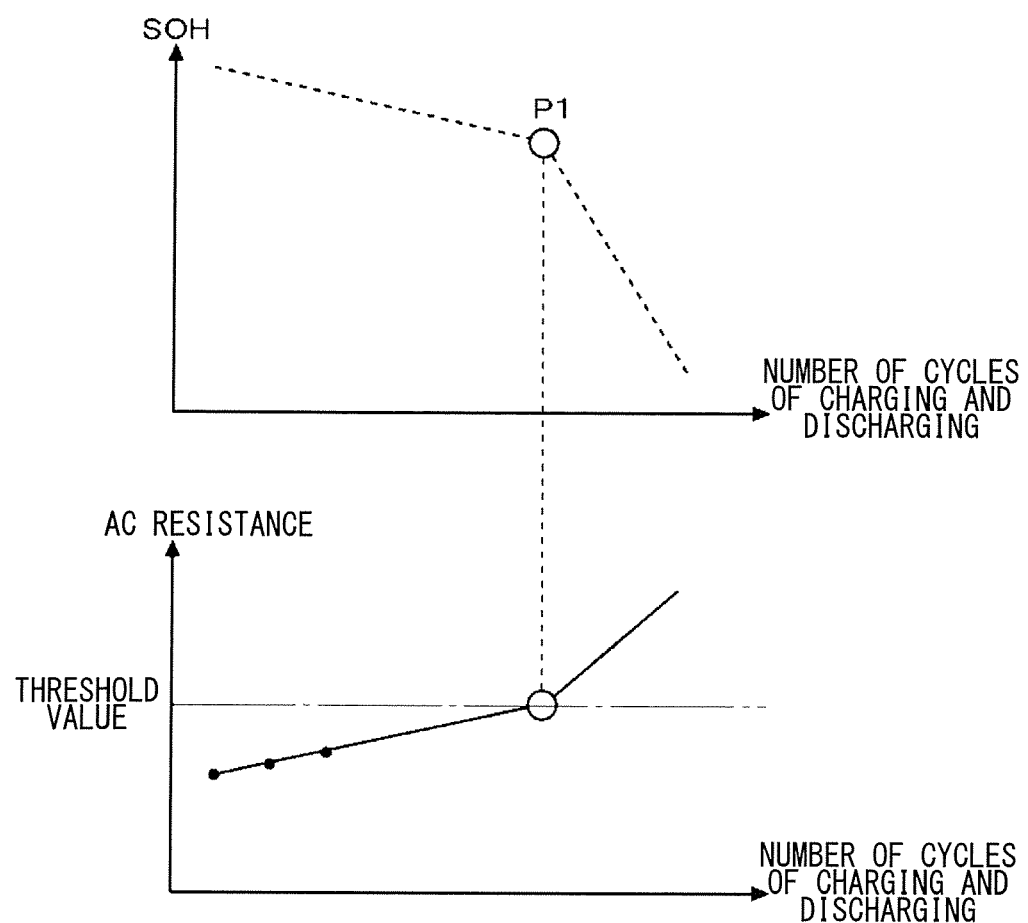
FIG. 2 schematically shows a relationship between the number of cycles of charging and discharging the battery and the SOH/AC resistance.

FIG. 2 schematically shows a relationship between the number of cycles of charging and discharging the battery and the SOH/AC resistance. As mentioned above, SOH drops as the number of cycles of charging and discharging increases. The accumulated amount of charged current [Ah], accumulated amount of discharged current [Ah], or accumulated amount of charged power [Wh], accumulated amount of discharged power [Wh] may be used in place of the number of cycles of charging and discharging. An abrupt degradation point P1 indicates a point where abrupt degradation of the battery occurs. Meanwhile, the AC resistance of the battery increases as the SOH drops. The AC resistance value determined when the SOH reaches the abrupt degradation point P1 is determined to be a threshold value for detecting the abrupt degradation point P1.

Figure 3:
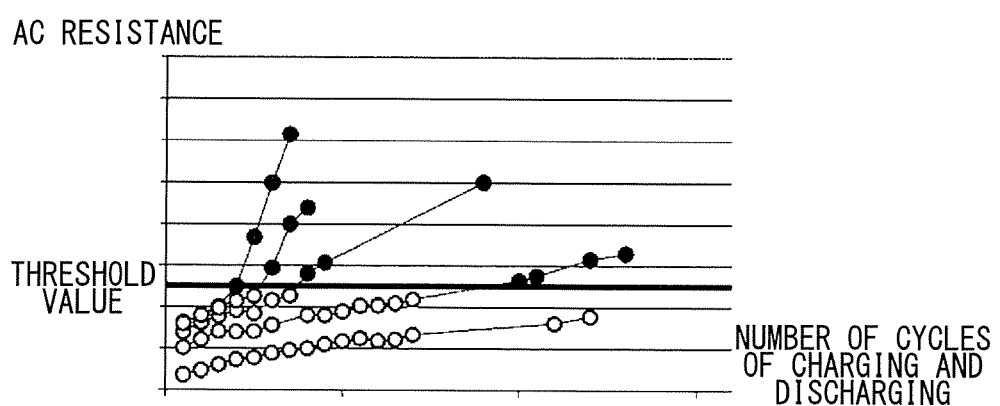
FIG. 3 shows plots of measurement data indicating a relationship between the number of cycles of charging and discharging and the AC resistance value.

FIG. 3 shows plots of measurement data indicating a relationship between the number of cycles of charging and discharging and the AC resistance value. The measurement data indicate the AC resistance measured by preserving the battery at a high temperature for a long period of time and then repeatedly charging and discharging the battery at a room temperature. Five items of measurement data are obtained by preserving five batteries of the same type in different preservation conditions and making measurements after the preservation. Parameters for preservation condition include the temperature at preservation, preservation period, and SOC at preservation. The measurement to obtain the five items of measurement data for the AC resistance is made in the same condition.

Referring to FIG. 3, blank circles indicate the AC resistance measured when abrupt capacity degradation does not occur. Solid circles indicate the AC resistance measured after abrupt capacity degradation occurs. The point of occurrence of abrupt degradation is estimated by identifying a point where the slope indicating the speed of increase of the AC resistance becomes steep. A threshold for detection of an abrupt degradation point P1 of the battery used is determined based on the measurement data as described above.

Figure 4:
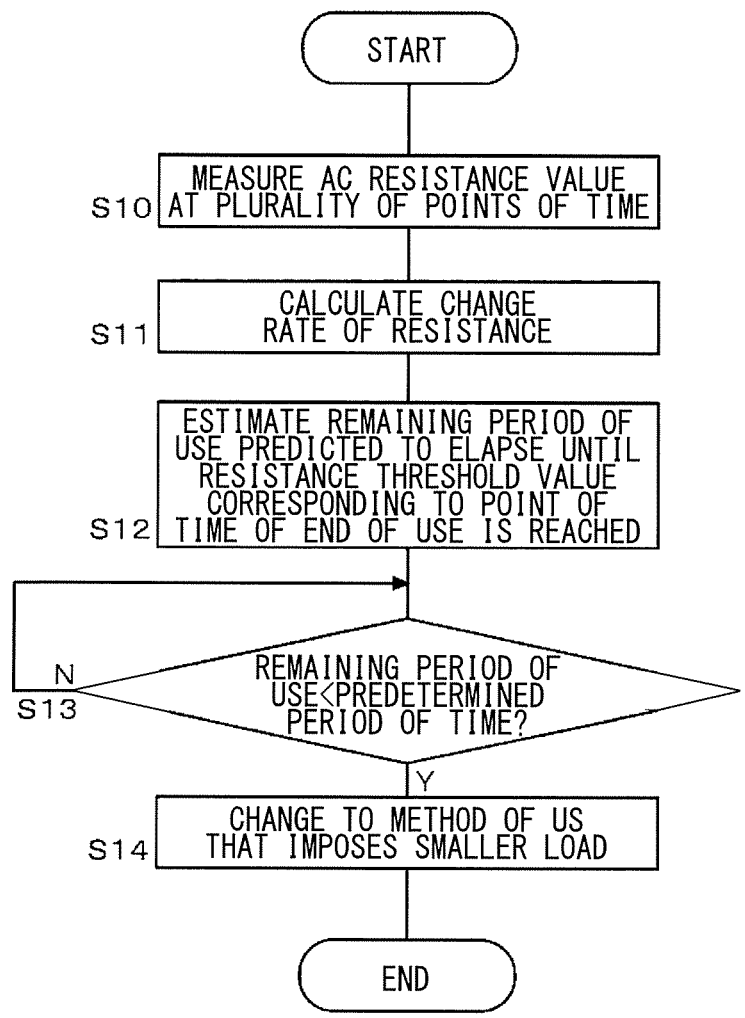
FIG. 4 is a flowchart showing the flow of operation of the battery system according to embodiment 1 of the present disclosure.

FIG. 4 is a flowchart showing the flow of operation of the battery system 1 according to embodiment 1 of the present disclosure. The state management unit 31 measures the AC resistance value of the secondary battery 10 at a plurality of different points of time (S10). More specifically, the state management unit 31 directs the oscillator 50 to generate an AC current Iac at a predetermined frequency to induce the AC current Iac in the secondary battery 10. It is preferred that the predetermined frequency has a value within a range 100 Hz-10 kHz. For example, 1 kHz is used. While the AC current Iac is flowing in the secondary battery 10, the state management unit 31 uses the voltage sensor 41 to measure the AC voltage Vac of the secondary battery 10. The state management unit 31 calculates a complex amplitude ratio |Vac/Iac| between the AC voltage Vac and the AC current Iac to measure the AC resistance value of the secondary battery 10.

The relationship between the current and the voltage may be reversed. In other words, the state management unit 31 directs the oscillator 50 to generate an AC voltage Vac at a predetermined frequency to apply the AC voltage Vac to the secondary battery 10. While the AC voltage Vac is being applied to the secondary battery 10, the state management unit 31 uses the current sensor 42 to measure the AC current Iac flowing through the secondary battery 10. The state management unit 31 calculates a complex amplitude ratio |Vac/Iac| between the AC voltage Vac and the AC current Iac to measure the AC resistance value of the secondary battery 10.

Subsequently, the state management unit 31 estimates predicted transition of the AC resistance value of the secondary battery 10 based on AC resistance values at a plurality of points of time. Specifically, the state management unit 31 estimates the change rate of the AC resistance value (S11). The AC resistance value does not necessarily rise linearly (law of power of 1) as shown in FIG. 2. The value may rise exponentially or logarithmically depending on the type of battery. In an ordinary battery, the AC resistance value rises according to a law of power of 0.3-1 with an increase in the number of cycles of charging and discharging.

The state management unit 31 refers to the estimated change rate of the AC resistance value and the current AC resistance value to estimate a period of use that remains (remaining period of use) predicted to elapse until the value reaches a resistance threshold value corresponding to the a point of time when the use of the secondary battery 10 is ended (point of time of end of use) (S12). The measured value may be used as the current AC resistance value. Alternatively, a value estimated from a past AC resistance value and the change rate of the resistance described above may be used. The remaining period of use is defined as a period of time elapsed until the AC resistance value reaches the above threshold resistance value, changing from the current AC resistance value at the change rate of the resistance described above. In the case of a common cylindrical lithium ion battery, the resistance threshold value is often found in a range 20-40 mΩ when an AC signal of 1 kHz is applied.

The state management unit 31 compares the estimated remaining period of use with a predetermined period of time (S13). In the case of a battery having a life of about ten years in normal use, the predetermined period of time is set to, for example, three years. When the remaining period of use is shorter than the predetermined period of time (Y in S13), the state management unit 31 notifies the operation management unit 32 that the remaining period of use is shorter than the predetermined period of time. The operation management unit 32 changes the method of use of the secondary battery 10 to a method of use that imposes a smaller load than the current method of use.

For example, the operation management unit 32 lowers the charging rate in the high SOC zone in which the SOC of the secondary battery 10 is higher than a predetermined value (e.g., 70%). Specifically, the operation management unit 32 lowers the current command value for charging in the high SOC zone. The operation management unit 32 may configure the charging rate in the high SOC zone such that the shorter the remaining period of use until the point of time of abrupt degradation, the lower the charging rate.

Alternatively, the operation management unit 32 may lower the charging rate at a temperature lower than a predetermined temperature (e.g., 0° C.). In this case, too, the charging rate may be configured such that the shorter the remaining period of use until the point of time of abrupt degradation, the lower the charging rate.

Alternatively, the operation management unit 32 may narrow the SOC range of the secondary battery 10 used. For example, the upper limit value of the SOC range used may be lowered. Alternatively, the lower limit value of the SOC range used may be raised. Both of the above measures may be executed. In the case the SOC range used in a stage where the remaining period of use is longer than the predetermined period of time is 0-100%, the SOC range is changed to 0-80%, 20-100%, or 20-80% when the remaining period of use is shorter than the predetermined period of time.

Thus, according to embodiment 1, the remaining period of use elapsed until the occurrence of abrupt degradation is predicted. When the remaining period of use is shorter than the predetermined period of time, the method of use of the secondary battery 10 is changed to a method of use that imposes a smaller load. This can delay occurrence of abrupt degradation of the secondary battery 10, which will extend the period of time during which the secondary battery 10 can be used safely. Since the remaining period of use can be estimated without disassembling the battery, performance degradation of the secondary battery 10 can be diagnosed without prohibiting the use of the secondary battery 10 by the user.

Figure 5:
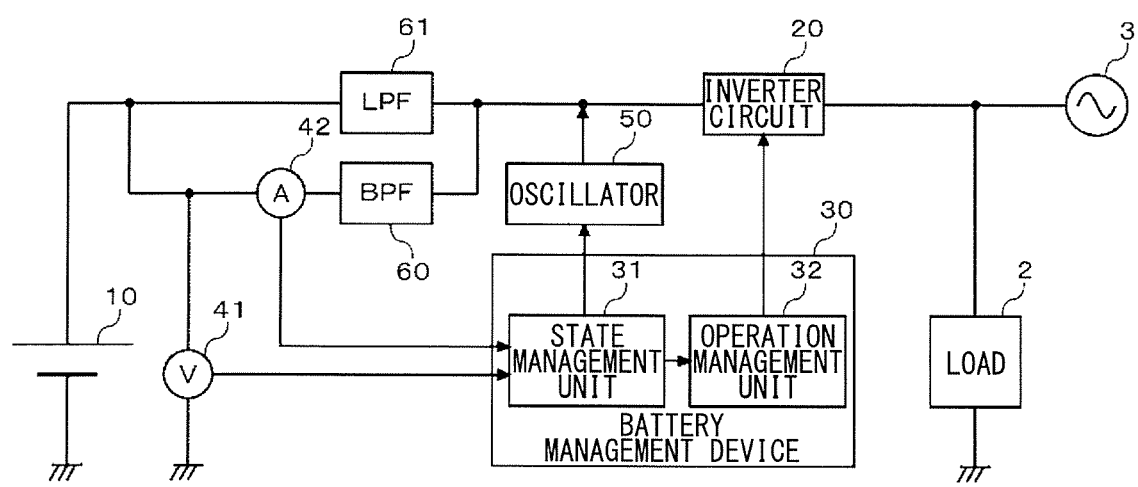
FIG. 5 shows an exemplary configuration of the battery system according to embodiment 2 of the present disclosure.

FIG. 5 shows an exemplary configuration of the battery system 1 according to embodiment 2 of the present invention. The battery system 1 according to embodiment 2 differs from the battery system 1 according to embodiment 1 in that a bypass circuit for detecting a high-frequency signal is provided in a current channel. A band-pass filter 60 is inserted in the bypass circuit. A low-pass filter 61 is inserted in the main current channel.

The low-pass filter 61 removes the high-frequency component of the charging/discharging current flowing through the main current channel. The band-pass filter 60 is a filter having a transmission peak near the above predetermined frequency (e.g., 1 kHz). The signal transmitted through the band-pass filter 60 contains only the high-frequency component near the above predetermined frequency. The voltage sensor 41 measures the high-frequency voltage transmitted through the band-pass filter 60, and the current sensor 42 measures the high-frequency current transmitted through the band-pass filter 60. A high-pass filter having a transmission peak near the above predetermined frequency may be used in place of the band-pass filter 60.

In the battery system 1 according to embodiment 2, the AC resistance value of the secondary battery 10 can be measured even while charging/discharging is being performed between the secondary battery 10 and the load 2/power system 3. During charging/discharging of the secondary battery 10, the state management unit 31 can direct the oscillator 50 to superimpose a sinusoidal current or a rectangular pulse current at the predetermined frequency on the charging/discharging current of the secondary battery 10.

Figure 6:
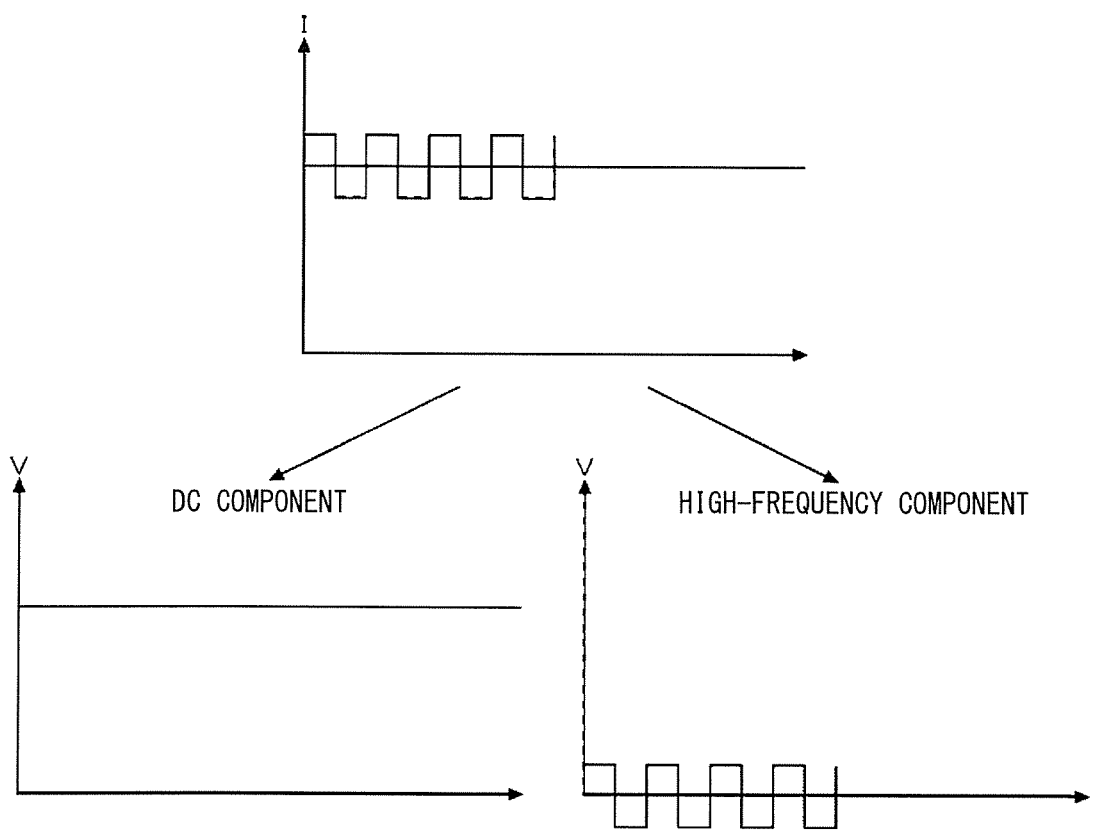
FIG. 6 schematically shows how the high-frequency component is isolated from the charging/discharging current on which the rectangular pulse current is superimposed.

FIG. 6 schematically shows how the high-frequency component is isolated from the charging/discharging current on which the rectangular pulse current is superimposed. The bottom right graph shows a high-frequency pulse voltage extracted from the charging/discharging current on which the rectangular pulse current is superimposed, by using the band-pass filter or the high-pass filter. The voltage sensor 41 measures the rectangular pulse voltage extracted. The state management unit 31 measures the AC resistance value of the secondary battery 10 by calculating a ratio V/I between the amplitude of the rectangular pulse current I superimposed and the amplitude of the rectangular pulse voltage V measured. The bottom left graph of FIG. 6 shows the DC charging/discharging current extracted from the charging/discharging current on which the rectangular pulse current is superimposed, by using the low-pass filter.

As described above, embodiment 2 provides the same advantage as embodiment 1. Further, the voltage/current of the high-frequency signal superimposed on the DC charging/discharging current can be measured with a high precision by providing the band-pass filter 60. Accordingly, the AC resistance value of the secondary battery 10 can be measured with a high precision even while the battery system 1 is charging or discharging the battery. The embodiment is suitable for applications in which power feeding from the secondary battery 10 to the load 2 cannot be stopped.

In the case the voltage and the current at the above predetermined frequency can be detected with a high precision from the value measured by the voltage sensor 41 and the value measured by the current sensor 42 even when a high-frequency signal is superimposed on the charging/discharging current, the bypass circuit and the band-pass filter 60 described above need not necessarily be provided.

Figure 7:
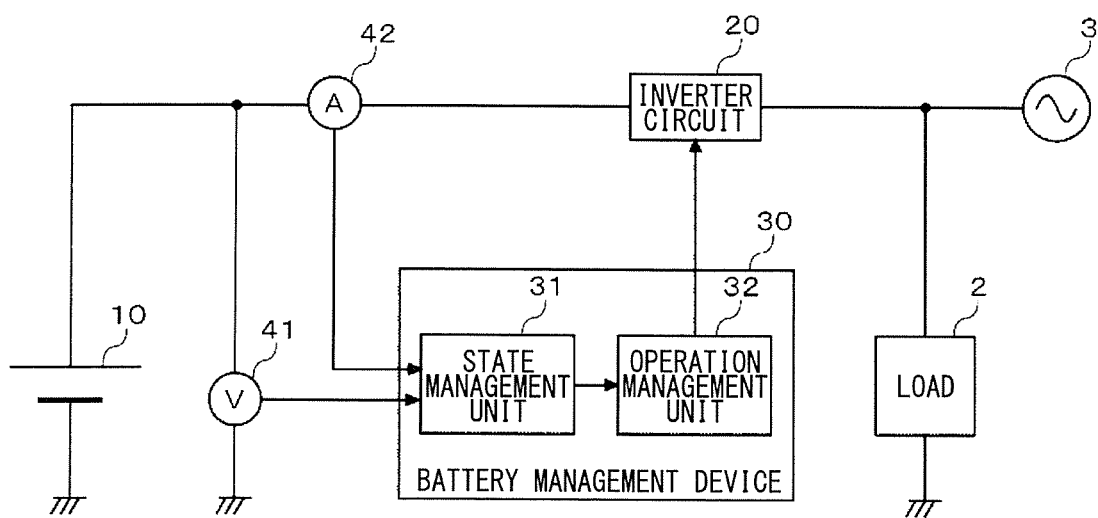
FIG. 7 shows an exemplary configuration of the battery system according to embodiment 3 of the present invention.

FIG. 7 shows an exemplary configuration of the battery system 1 according to embodiment 3 of the present disclosure. The battery system 1 according to embodiment 3 is configured such that the oscillator 50 is omitted from the battery system 1 according to embodiment 1. The AC resistance value of the secondary battery 10 can be estimated without applying an AC signal to the secondary battery 10, by measuring a transient response when charging/discharging is started or when charging/discharging is stopped.

The state management unit 31 causes the operation management unit 32 to start charging or discharging the secondary battery 10 with a predetermined current value I. The state management unit 31 uses the voltage sensor 41 to measure a value of voltage variation $\Delta V$ of the secondary battery 10 in a predetermined period of time since the start of charging or discharging. The predetermined period of time is preferably 10 ms or shorter, and, more preferably, 1 ms or shorter. For example, 0.5 ms is used as the predetermined period of time. 0.5 ms corresponds to the predetermined frequency 1 kHz described above.

The state management unit 31 estimates the AC resistance value from a ratio $\Delta V/I$ between the value of voltage variation $\Delta V$ measured and the predetermined current value I. When charging or discharging is started, the current rises to the predetermined current value I instantly, but the voltage rises slowly in accordance with the AC resistance value.

Alternatively, the AC resistance value of the secondary battery 10 can be estimated from the transient response characteristics that occur when charging or discharging is ended. While the secondary battery 10 is being charged or discharged with the predetermined current value I, the state management unit 31 causes the operation management unit 32 to stop charging or discharging the secondary battery 10. The state management unit 31 uses the voltage sensor 41 to measure a value of voltage variation $\Delta V$ of the secondary battery 10 in a predetermined period of time since the time when charging or discharging is stopped. The state management unit 31 estimates the AC resistance value of the secondary battery 10 from a ratio $\Delta V/I$ between the value of voltage variation $\Delta V$ measured and the current value I. When charging or discharging is stopped, the current drops to zero instantly, but the voltage drops to zero slowly in accordance with the AC resistance value.

Figure 8:
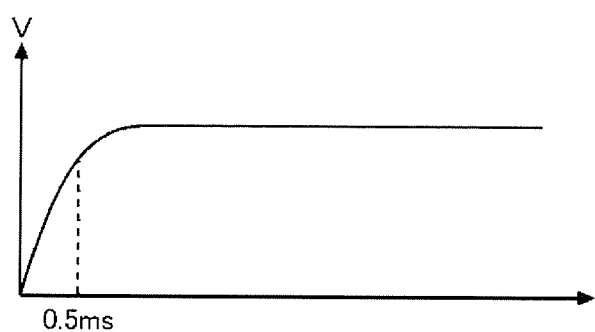
FIG. 8 shows an example of voltage transition that occurs when the secondary battery is started to be charged or discharged.

FIG. 8 shows an example of voltage transition that occurs when the secondary battery 10 is started to be charged or discharged. By measuring the voltage after 0.5 ms since the start of charging or discharging as shown in FIG. 8, the AC resistance value of the secondary battery 10 can be estimated.

The current value may be increased in multiple stages to a target current value when charging or discharging is started. In that case, transient response can be measured in each of the stages. After causing the operation management unit 32 to start charging or discharging the secondary battery 10, the state management unit 31 changes the charging current or the discharging current of the secondary battery 10 in multiple stages until the charging current or the discharging current of the secondary battery 10 reaches the current value that should be supplied to the load 2.

The state management unit 31 uses the voltage sensor 41 to measure a value of voltage variation $\Delta V$ of the secondary battery 10 in each stage. The state management unit 31 estimates the AC resistance value of the secondary battery 10 in each stage from a ratio $\Delta V/I$ between the value of voltage variation $\Delta V$ measured in each stage and the current value I induced in each stage. The state management unit 31 calculates an average value of the AC resistance values in the respective stages and determines the AC resistance value of the secondary battery 10 ultimately.

Alternatively, the current value at the present point of time may be lowered to zero in multiple stages when charging or discharging is ended. In that case, transient response can be measured in each stage. While the secondary battery 10 is being charged or discharged with the predetermined current value I, the state management unit 31 causes the operation management unit 32 to change the charging current or the discharging current of the secondary battery 10 in stages until the current value reaches zero.

The state management unit 31 uses the voltage sensor 41 to measure the value of voltage variation $\Delta V$ of the secondary battery 10 in each stage. The state management unit 31 estimates the AC resistance value of the secondary battery 10 in each stage from a ratio $\Delta V/I$ between the value of voltage variation $\Delta V$ measured in each stage and the current value I induced in each stage. The state management unit 31 calculates an average value of the AC resistance values in the respective stages and determines the AC resistance value of the secondary battery 10 ultimately.

Figure 9:
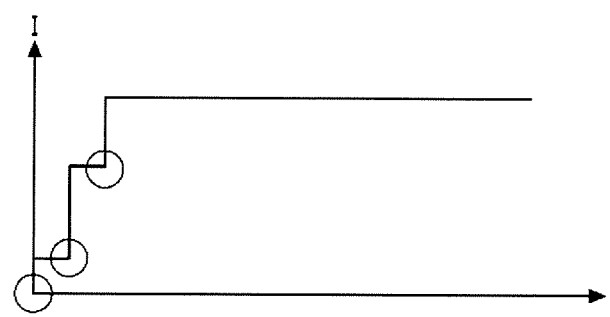
FIG. 9 shows an example of current transition during multiple-stage pulsed charging/discharging of the secondary battery.

FIG. 9 shows an example of current transition during multiple-stage pulsed charging/discharging of the secondary battery 10. In FIG. 9, the AC resistance value of the secondary battery 10 is estimated in three stages and used by averaging the values.

As described above, embodiment 3 provides the same advantage as embodiment 1. Further, since the oscillator 50 is not necessary, the addition cost incurred by adding the oscillator 50 is eliminated. This is particularly useful in power storage systems in which the oscillator 50 is not inherently provided. Further, the impact from instantaneous noise is reduced by measuring transient response in multiple stages and estimating the AC resistance value by averaging the values.

Described above is an explanation based on an exemplary embodiment. The embodiment is intended to be illustrative only and it will be obvious to those skilled in the art that various modifications to constituting elements and processes could be developed and that such modifications are also within the scope of the present disclosure.

In the above embodiment, a description is given of an example in which the method of use of the secondary battery 10 is changed to a method of use that imposes a smaller load when the remaining period of use of the secondary battery 10 is shorter than the predetermined period of time. In one variation, the use of the secondary battery 10 may be stopped. For example, the use of the secondary battery 10 can be ended before the probability of an unsafe event increases, by configuring the predetermined period of time to be short and stopping the use of the secondary battery 10 at a point of time relatively close to the arrival of abrupt degradation.

The embodiments may be defined by the following items.

[Item 1]

A battery management device (30) including: a state management unit (31) that measures or estimates an AC resistance value of a secondary battery (10) at a plurality of points of time, estimates transition of the AC resistance value of the secondary battery (10) by referring to AC resistance values at the plurality of points of time, and estimates a remaining period of use elapsed until the AC resistance value of the secondary battery (10) reaches a resistance threshold value corresponding to a point of time of end of use of the secondary battery (10); and an operation management unit (32) that changes a method of use of the secondary battery (10) to a method of use that imposes a smaller load or stops using the secondary battery (10), when the remaining period of use of the secondary battery (10) is shorter than a predetermined period of time.

According to this embodiment, occurrence of abrupt capacity degradation of the secondary battery (10) can be delayed or avoided.

[Item 2]

The battery management device (30) according to item 1, wherein the state management unit (31) measures an AC voltage of the secondary battery (10) by inducing an AC current of a predetermined frequency in the secondary battery (10) and measures the AC resistance value by calculating a complex amplitude ratio between the AC voltage and the AC current.

According to this embodiment, the state of internal degradation of the secondary battery (10) such as decrease in electrolysis solution can be estimated without disassembling the secondary battery (10).

[Item 3]

The battery management device (30) according to item 1, wherein the state management unit (31) measures an AC current of the secondary battery (20) by applying an AC voltage of a predetermined frequency to the secondary battery (10) and measures the AC resistance value by calculating a complex amplitude ratio between the AC voltage and the AC current.

According to this embodiment, the state of internal degradation of the secondary battery (10) can be estimated without disassembling the secondary battery (10).

[Item 4]

The battery management device (30) according to item 2 or 3, wherein the predetermined frequency is of a value in a range 100 Hz-10 kHz.

According to this embodiment, the state of internal degradation of the secondary battery (10) can be estimated with a high precision.

[Item 5]

The battery management device (30) according to item 2 or 3, wherein the predetermined frequency is 1 kHz.

According to this embodiment, the state of internal degradation of the secondary battery (10) can be estimated with a high precision.

[Item 6]

The battery management device (30) according to any one of items 2 through 5, further comprising: a band-pass filter (60) having a transmission peak near the predetermined frequency.

According to this embodiment, the high-frequency voltage/current of the secondary battery (10) can be estimated with a high precision.

[Item 7]

The battery management device (30) according to any one of items 1 through 6, wherein the state management unit (31) causes a sinusoidal current or a rectangular pulse current to be superimposed on a charging current or a discharging current of the secondary battery (10) and measures the AC resistance value by calculating a ratio between an amplitude of the superimposed current and an amplitude of an AC voltage measured.

According to this embodiment, the AC resistance value of the secondary battery (10) can be measured even while the secondary battery (10) is being charged or discharged.

[Item 8]

The battery management device (30) according to item 1, wherein the state management unit (31) starts charging or discharging the secondary battery (10) with a predetermined current value, measures a value of voltage change of the secondary battery (10) in a predetermined period of time since charging or discharging is started, and estimates the AC resistance value from a ratio between the value of voltage change and the predetermined current value.

According to this embodiment, the state of internal degradation of the secondary battery (10) can be estimated without using an AC signal source.

[Item 9]

The battery management device (30) according to item 8, wherein the predetermined period of time is 10 ms or shorter.

According to this embodiment, the state of internal degradation of the secondary battery (10) can be estimated with a high precision.

[Item 10]

The battery management device (30) according to item 8, wherein the predetermined period of time is 1 ms or shorter.

According to this embodiment, the state of internal degradation of the secondary battery (10) can be estimated with a high precision.

[Item 11]

The battery management device (30) according to item 8, wherein the predetermined period of time is 0.5 ms.

According to this embodiment, the state of internal degradation of the secondary battery (10) can be estimated with a high precision.

[Item 12]

The battery management device (30) according to item 1, wherein, after the secondary battery (10) is started to be charged or discharged, the state management unit (31) changes a charging current or a discharging current of the secondary battery (10) in stages until the charging current or the discharging current of the secondary battery (10) reaches a current value defined by a load (2), measures a value of voltage change of the secondary battery (10) in each stage, and estimates the AC resistance value in each state.

According to this embodiment, a plurality of transient responses can be measured when charging/discharging is started/ended.

[Item 13]

The battery management device (30) according to item 12, wherein the state management unit (31) calculates an average value of AC resistance values of the respective stages.

According to this embodiment, the impact of instantaneous noise can be reduced by averaging a plurality of measurements.

[Item 14]

The battery management device (30) according to any one of items 1 through 13, wherein, when the remaining period of use of the secondary battery (10) is shorter than the predetermined period of time, the operation management unit (32) lowers a charging rate in a high SOC zone in which state of charge (SOC) of the secondary battery (10) is higher than a predetermined value.

According to this embodiment, the load on the secondary battery (10) can be reduced.

[Item 15]

The battery management device (30) according to any one of items 1 through 14, wherein, when the remaining period of use of the secondary battery (10) is shorter than the predetermined period of time, the operation management unit (32) lowers a charging rate at a temperature lower than a predetermined temperature.

According to this embodiment, the load on the secondary battery (10) can be reduced.

[Item 16]

The battery management device (30) according to any one of items 1 through 15, wherein, when the remaining period of use of the secondary battery (10) is shorter than the predetermined period of time, the operation management unit (32) either lowers an upper limit value of a SOC range of the secondary battery (10) used or raises a lower limit value of the SOC range of the secondary battery (10) used.

According to this embodiment, the load on the secondary battery (10) can be reduced.

[Item 17]

A battery system (1) including: a secondary battery (10); and the battery management device (30) according to any one of items 1 through 16.

According to this embodiment, abrupt capacity degradation of the secondary battery (10) can be delayed or avoided.

[Item 18]

A battery management method including: measuring or estimating an AC resistance value of a secondary battery (10) at a plurality of points of time, estimating transition of the AC resistance value of the secondary battery (10) by referring to AC resistance values at the plurality of points of time, and estimates a remaining period of use elapsed until the AC resistance value of the secondary battery (10) reaches a resistance threshold value corresponding to a point of time of end of use of the secondary battery (10); and changing a method of use of the secondary battery (10) to a method of use that imposes a smaller load or stops using the secondary battery (10), when the remaining period of use of the secondary battery (10) is shorter than a predetermined period of time.

According to this embodiment, abrupt capacity degradation of the secondary battery (10) can be delayed or avoided.

REFERENCE SIGNS LIST 1 battery system
2 load
3 power system
10 secondary battery
20 inverter circuit
30 battery management device
31 state management unit
32 operation management unit
41 voltage sensor
42 current sensor
50 oscillator
60 band-pass filter
61 low-pass filter

The invention claimed is:

1. A battery management device comprising:
a state management unit that estimates first values of AC resistance of a secondary battery at a plurality of points of time, estimates transition of a value of the AC resistance of the secondary battery by referring to the estimated first values, and estimates a remaining period of use elapsed until the value of the AC resistance of the secondary battery reaches a resistance threshold value corresponding to a point of time of end of use of the secondary battery; and
an operation management unit that changes a method of use of the secondary battery to a method of use that imposes a smaller load or stops using the secondary battery, when the remaining period of use of the secondary battery is shorter than a predetermined period of time,
wherein when estimating each first value of the AC resistance of the secondary battery at a respective point of time, the state management unit changes, after the secondary battery is started to be charged or discharged, a charging current or a discharging current of the secondary battery in stages until the charging current or the discharging current of the secondary battery reaches a current value defined by a load, measures values of voltage changes of the secondary battery in the stages, and estimates second values of the AC resistance in the stages.

2. The battery management device according to claim 1, wherein the state management unit calculates an average value of AC resistance values of the respective stages.

3. The battery management device according claim 1, wherein when the remaining period of use of the secondary battery is shorter than the predetermined period of time, the operation management unit lowers a charging rate in a high SOC zone in which state of charge (SOC) of the secondary battery is higher than a predetermined value.

4. The battery management device according to claim 1, wherein when the remaining period of use of the secondary battery is shorter than the predetermined period of time, the operation management unit lowers a charging rate at a temperature lower than a predetermined temperature.

5. The battery management device according to claim 1, wherein when the remaining period of use of the secondary battery is shorter than the predetermined period of time, the operation management unit either lowers an upper limit value of a SOC range of the secondary battery used or raises a lower limit value of the SOC range of the secondary battery used.

6. A battery system comprising:
a secondary battery; and
the battery management device according to claim 1.

7. The battery management device according to claim 1, wherein the state management unit calculates an average value of the estimated second values to estimate a respective first value of the AC resistance of the secondary battery.

8. A battery management method comprising:
estimating first values of AC resistance of a secondary battery at a plurality of points of time, estimating transition of a value of the AC resistance of the secondary battery by referring to the estimated first values, and estimating a remaining period of use elapsed until the value of the AC resistance of the secondary battery reaches a resistance threshold value corresponding to a point of time of end of use of the secondary battery; and
changing a method of use of the secondary battery to a method of use that imposes a smaller load or stops using the secondary battery, when the remaining period of use of the secondary battery is shorter than a predetermined period of time,
wherein the estimating each first value of the AC resistance of the secondary battery includes, after the secondary battery is started to be charged or discharged, changing a charging current or a discharging current of the secondary battery in stages until the charging current or the discharging current of the secondary battery reaches a current value defined by a load, measuring values of voltage changes of the secondary battery in the stages, and estimating second values of the AC resistance in the stages.

9. The battery management method according to claim 8, wherein the estimating each first value of the AC resistance of the secondary battery includes calculating an average value of the estimated second values to estimate a respective first value of the AC resistance of the secondary battery.

\* \* \* \* \*